(12) United States Patent
Chung

(10) Patent No.: US 8,260,449 B2
(45) Date of Patent: Sep. 4, 2012

(54) PHOTOLITHOGRAPHY SYSTEMS AND ASSOCIATED METHODS OF OVERLAY ERROR CORRECTION

(75) Inventor: Woong Jae Chung, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 736 days.

(21) Appl. No.: 12/266,276

(22) Filed: Nov. 6, 2008

(65) Prior Publication Data

US 2010/0112467 A1 May 6, 2010

(51) Int. Cl.
*G06F 19/00* (2011.01)
*G03B 27/32* (2006.01)

(52) U.S. Cl. .......................................... 700/121; 355/77
(58) Field of Classification Search .................... 355/53, 355/55, 77; 700/121; 257/E21.521
See application file for complete search history.

(56) References Cited

U.S. PATENT DOCUMENTS

| | | | |
|---|---|---|---|
| 6,826,743 B2* | 11/2004 | Park et al. | 430/22 |
| 6,841,889 B2 | 1/2005 | Baggenstoss | |
| 7,042,552 B1* | 5/2006 | Werkman et al. | 355/55 |
| 2006/0040191 A1 | 2/2006 | Okita | |
| 2006/0210893 A1* | 9/2006 | Van Bilsen | 430/30 |
| 2006/0279722 A1* | 12/2006 | De Mol | 355/77 |
| 2007/0177120 A1 | 8/2007 | Kim | |
| 2007/0233305 A1* | 10/2007 | Werkman et al. | 700/121 |
| 2008/0030701 A1* | 2/2008 | Lof | 355/53 |

* cited by examiner

*Primary Examiner* — Hung Henry Nguyen
*Assistant Examiner* — Steven H Whitesell Gordon
(74) *Attorney, Agent, or Firm* — Perkins Coie LLP

(57) ABSTRACT

Several embodiments of photolithography systems and associated methods of overlay error correction are disclosed herein. In one embodiment, a method for correcting overlay errors in a photolithography system includes measuring a plurality of first overlay errors that individually correspond to a microelectronic substrate in a first batch of microelectronic substrates. The method also includes determining a relationship between the first overlay errors and a first sequence of the microelectronic substrates in the first batch. The method further includes correcting a second overlay error of individual microelectronic substrates in a second batch based on a second sequence of the microelectronic substrates in the second batch and the determined relationship.

20 Claims, 8 Drawing Sheets

175

| 176 | 177 | 178 | 179 | 180 | 181 | 182 |
|---|---|---|---|---|---|---|
| Substrate No. | X-translation | Y-translation | Substrate rotation | Substrate orthogonality | Field Mag. | Asym. mag. |

| 183 | 184 | 185 | 186 | 187 | | 188 |
|---|---|---|---|---|---|---|
| Field rotation | Field asym. rotation | Substrate expansion X-axis | Substrate expansion Y-axis | MPE X-axis | ... | MPE Y-axis |

*FIG. 7*

PHOTOLITHOGRAPHY SYSTEMS AND ASSOCIATED METHODS OF OVERLAY ERROR CORRECTION

TECHNICAL FIELD

The present disclosure is related to photolithography devices and associated methods of overlay correction.

BACKGROUND

Photolithography is a process commonly used in semiconductor fabrication for selectively removing portions of a thin film from or depositing portions of a film onto discrete areas of a surface of a semiconductor wafer. A typical photolithography process includes spin coating a layer of a light-sensitive material (commonly referred to as a "photoresist") onto the surface of the semiconductor wafer. The semiconductor wafer is then exposed to a pattern of light that chemically modifies a portion of the photoresist incident to the light. The process further includes removing one of the incident portion or the non-incident portion from the surface of the semiconductor wafer with a chemical solution (e.g., a "developer") to form a pattern of openings in the photoresist on the wafer. Subsequently, portions of the thin film on the surface of the semiconductor wafer can be selectively removed from or deposited onto the surface of the wafer through the openings of the photoresist mask.

The size of individual components in semiconductor devices is constantly decreasing in the semiconductor industry. The ever smaller components require ever more precise placement of circuit patterns on the semiconductor wafers. As a result, semiconductor manufacturers and photolithography tool providers are under continued pressure to reduce overlay tolerances and/or other image-placement errors. Accordingly, several improvements in reducing such image-placement errors may be desirable.

BRIEF DESCRIPTION OF THE DRAWINGS

FIG. 7 is a database schema illustrating an organization of an overlay error record in accordance with embodiments of the disclosure.

DETAILED DESCRIPTION

Various embodiments of photolithography systems for processing microelectronic substrates and associated overlay correction methods are described below. The term "microelectronic substrate" is used throughout to include substrates upon which and/or in which microelectronic devices, micromechanical devices, data storage elements, read/write components, other features are fabricated. Such a microelectronic substrate can include one or more conductive and/or nonconductive layers (e.g., metallic, semiconductive, and/or dielectric layers) that are situated upon or within one another. These conductive and/or nonconductive layers can also include a wide variety of electrical elements, mechanical elements, and/or systems of such elements in the conductive and/or nonconductive layers (e.g., an integrated circuit, a memory, a processor, a microelectromechanical system, an imager, etc.) The term "photoresist" generally refers to a material that can be chemically modified when exposed to electromagnetic radiation. The term encompasses both positive photoresist that is configured to be soluble when activated by the electromagnetic radiation and negative photoresist that is configured to be insoluble when activated by light. A person skilled in the relevant art will also understand that the disclosure may have additional embodiments, and that the disclosure may be practiced without several of the details of the embodiments described below with reference to FIGS. 1-8.

Figure 1:
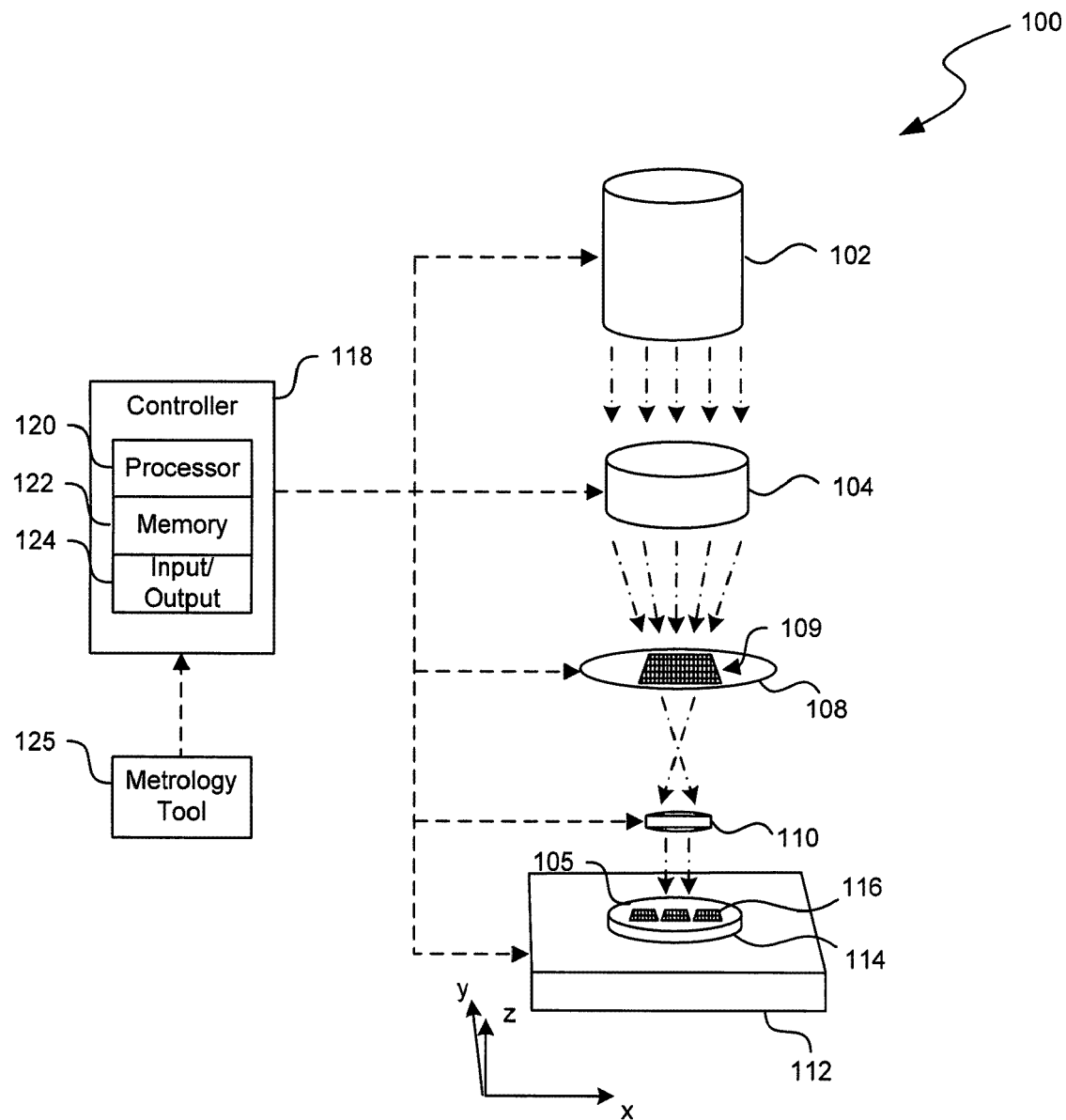
FIG. 1 is a schematic view of a photolithography system configured in accordance with an embodiment of the disclosure.

FIG. 1 is a schematic view of a photolithography system 100 configured in accordance with an embodiment of the disclosure. In the embodiment illustrated in FIG. 1, the photolithography system 100 includes an illumination source 102, a condenser lens 104, a reticle 108, an objective lens 110, and a substrate support 112 arranged in series. The photolithography system 100 can optionally include a metrology tool 125 configured to determine feature dimensions on microelectronic substrates. A controller 118 is operatively coupled to the various components of the photolithography system 100 for monitoring and/or controlling the operation of these components. In other embodiments, the photolithography system 100 can also include a substrate transport station, a structural support (e.g., a reticle support, a lens support, etc.), position sensors (e.g., a scatterometer), an immersion hood, a support actuator (e.g., an electric motor), and/or other suitable mechanical and/or electrical components.

The illumination source 102 can include an ultraviolet light source (e.g., a fluorescent lamp), a laser source (e.g., an argon fluoride excimer laser), and/or other suitable electromagnetic emission sources. The illumination source 102 can also include lenses, collimators, mirrors, and/or other suitable conditioning components (not shown). In certain embodiments, the illumination source 102 can be configured to produce a generally coherent illumination at a single frequency. In other embodiments, the illumination source 102 can also be at least partially incoherent. In further embodiments, the illumination source 102 can also be configured to generate illumination at multiple frequencies.

The condenser lens 104 can be configured to concentrate the illumination from the illumination source 102 onto the reticle 108. In certain embodiments, the condenser lens 104 can include a plurality of reflective and/or refractive lenses arranged in series. In other embodiments, the condenser lens 104 can also include collimators, mirrors, and/or other suitable illumination conditioning components. The photolithography system can also include actuators (e.g., electric motors) configured to move the condenser lens 104 relative to the illumination source 102 and/or the reticle 108 based on instructions from the controller 118.

The reticle 108 can include an opaque plate with lines, apertures, and/or transparencies that allow the illumination from the illumination source 102 to pass through in a defined pattern 109. In the illustrated embodiment, the pattern 109 includes a grating. In other embodiments, the pattern 109 can also include a collection of lines, channels, apertures, shapes, and/or other geometric elements in a suitable arrangement. In further embodiments, the reticle 108 can also include layers of material with different refraction index values and/or other suitable phase-shifting components (not shown). As a result, the reticle 108 can achieve a desired phase shift (e.g., 180°) between illumination transmitted through the pattern 109 and illumination that is transmitted through another area of the reticle 108.

The objective lens 110 can be configured to project the illumination from the reticle 108 onto the photoresist 105 of the microelectronic substrate 114. As shown in FIG. 1, the photoresist 105 of the microelectronic substrate 114 can be divided into discrete areas (hereinafter referred to as "fields 116"). During exposure, the pattern 109 from the reticle 108 can be replicated or printed individually onto one of the fields 116. Even though the fields 116 are shown in FIG. 1 as spaced apart from one another, in other embodiments, adjacent fields 116 can be abutting one another, or the fields 116 can have other suitable arrangements relative to one another.

The substrate support 112 can be configured to carry the microelectronic substrate 114. The substrate support 112 can include a vacuum chuck, a mechanical chuck, and/or other suitable supporting devices. In the illustrated embodiment, the photolithography system 100 includes at least one actuator (not shown) configured to move the substrate support 112 laterally (as indicated by the X-axis), transversely (as indicated by the Y-axis), and/or vertically (as indicated by the Z-axis) relative to the reticle 108 and/or other components of the photolithography system 100. Even though only one substrate support 112 is shown in FIG. 1, in certain embodiments, the photolithography system 100 can include two, three, or any desired number of substrate supports with structures and/or functions that are generally similar to or different than the substrate support 112.

The controller 118 can include a processor 120 coupled to a memory 122 and an input/output component 124. The processor 120 can include a microprocessor, a field-programmable gate array, and/or other suitable logic devices. The memory 122 can include volatile and/or nonvolatile media (e.g., ROM; RAM, magnetic disk storage media; optical storage media; flash memory devices, and/or other suitable storage media) and/or other types of computer-readable storage media configured to store data received from, as well as instructions for, the processor 120. The input/output component 124 can include a display, a touch screen, a keyboard, a mouse, and/or other suitable types of input/output devices configured to accept input from and provide output to an operator.

In certain embodiments, the controller 118 can include a personal computer operatively coupled to the other components of the photolithography system 100 via a communication link (e.g., a USB link, an Ethernet link, a Bluetooth link, etc.) In other embodiments, the controller 118 can include a network server operatively coupled to the other components of the photolithography system 100 via a network connection (e.g., an internet connection, an intranet connection, etc.) In further embodiments, the controller 118 can include a process logic controller, a distributed control system, and/or other suitable computing frameworks.

In operation, the photolithography system 100 can first receive a batch of microelectronic substrates 114 in a substrate transport station (not shown) and/or other suitable substrate holding device. The batch can include any desired number of microelectronic substrates 114, such as 15 or 25. A first microelectronic substrate 114 is loaded onto the substrate support 112, and the photolithography system 100 exposes individual fields 116 of the first microelectronic substrate 114 to the illumination source 102 to print a copy of the pattern 109 in the individual fields 116.

In certain embodiments, the photolithography system 100 can expose the individual fields 116 of the microelectronic substrate 114 in a step mode. For example, the controller 118 can energize the actuator(s) to move the substrate support 112 a discrete distance (commonly referred to as a "step") along the X-axis or the Y-axis. Once the field 116 is in position, the illumination source 102 illuminates the incident field 116 through the reticle 108 for a preselected period of time. The illumination is then turned off, and the controller 118 energizes the actuator(s) to move the substrate support 112 another step along either the X-axis or the Y-axis. A subsequent field 116 is exposed in a similar fashion, and this process is repeated until all of the fields 116 are exposed.

In other embodiments, the controller 118 can operate the photolithography system 100 in a scanning mode. For example, the controller 118 can control the actuators to move the substrate support 112 continuously along the X-axis or the Y-axis at a preselected speed in a first direction or a second direction opposite the first direction. As the fields 116 move along the X-axis or the Y-axis, the illumination source 102 illuminates the photoresist 105 on the microelectronic substrate 114 to print a copy of the pattern 109 in the individual fields 116. In further embodiments, the controller 118 can cause the photolithography system 100 to operate in a combination of the step mode and scanning mode.

After all the fields 116 on the first microelectronic substrate 114 are exposed, the first microelectronic substrate 114 can be removed from the substrate support 112 and undergo photoresist developing, baking, cleaning, and/or other suitable processing. A second microelectronic substrate 114 can then be loaded onto the substrate support 112 from the batch, and the foregoing exposure procedures can be repeated until at least some of the microelectronic substrates 114 in the batch are processed.

One operational difficulty with conventional implementations of the foregoing technique is that the photolithography system 100 may not adequately correct for overlay errors when exposing the individual microelectronic substrates 114. One conventional technique of overlay correction includes applying linear or higher order corrections with the same overlay parameters for all the microelectronic substrates 114 in the batch. The conventional technique, however, does not take into account substrate-to-substrate differences in the overlay errors. The inventor has recognized that as the photolithography system 100 processes each of the microelectronic substrates 114, the overlay errors tend to vary from substrate to substrate. Without being bound by theory, it is believed that such substrate-to-substrate variation may be due to temperature changes in the condenser lens 104, the objective lens 110, the other components of the photolithography system 100, and/or the microelectronic substrate 114. It is also believed that the focus shift of the condenser lens 104 and/or the objective lens 110, stepping/scanning errors in the substrate support 112, and/or other factors may lead to such substrate-to-substrate variation in the overlay errors.

Several embodiments of the photolithography system 100 can address the foregoing substrate-to-substrate variations in the overlay errors by (1) measuring an overlay error of the individual microelectronic substrates 114 in a batch; (2)

developing a model of the overlay errors in the batch; and (3) correcting the overlay errors based on the developed model during exposure. Simulation results of the microelectronic substrates 114 processed according to several embodiments of the photolithography system 100 are schematically illustrated in FIGS. 2-5. However, other embodiments of the photolithography system 100 can be configured to perform other processing stages in addition to or in lieu of those described below.

Figure 2:
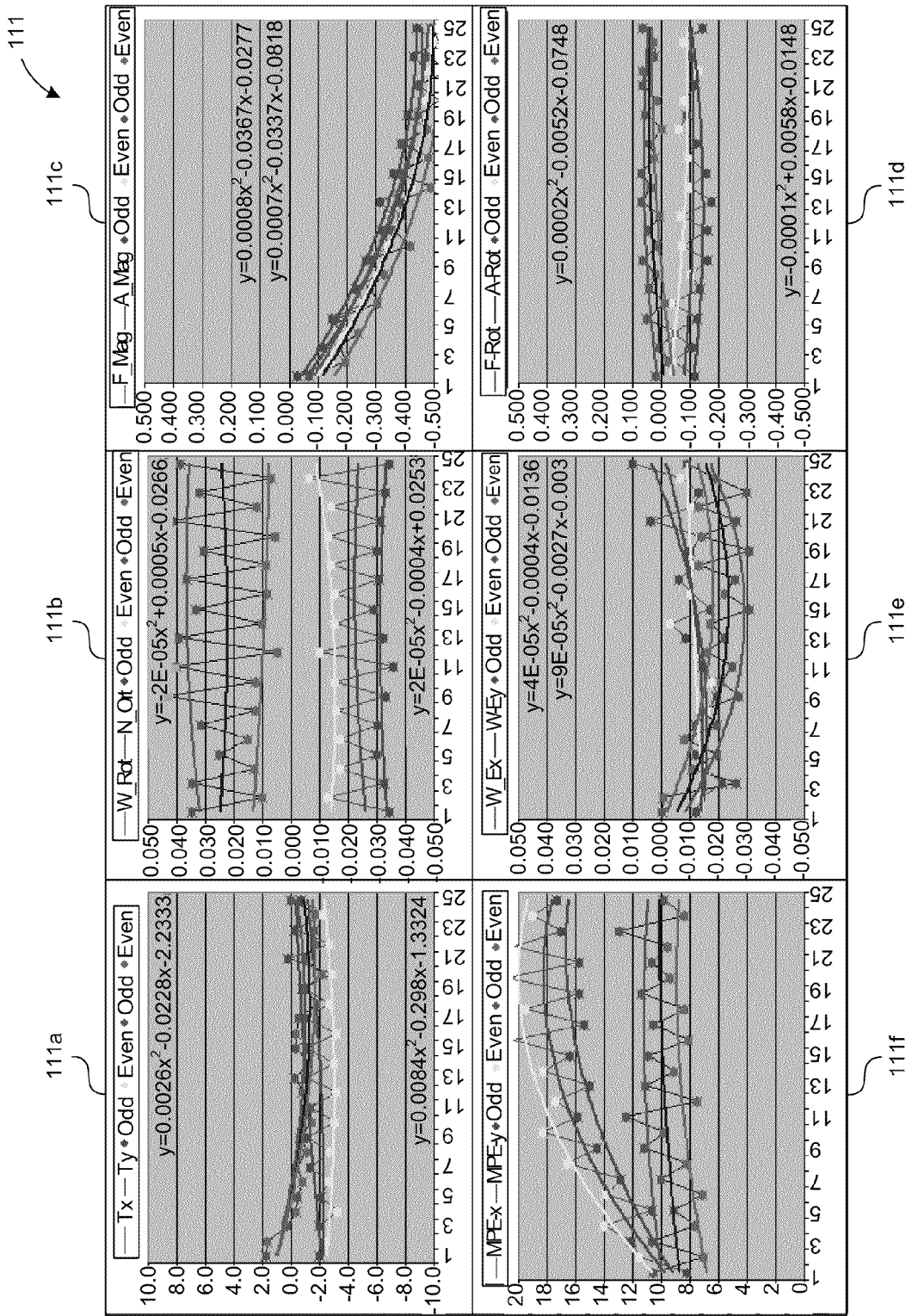
FIG. 2 contains plots of overlay error versus a sequence of microelectronic substrates in a batch of microelectronic substrates in accordance with embodiments of the disclosure.

During an initial processing stage, an operator can measure an overlay error of the individual microelectronic substrates 114 in the batch and store the measurements in the memory 122. In certain embodiments, the operator may use a stand-alone metrology tool to measure the overlay errors. In other embodiments, the operator may use the metrology tool 125 integrated into the photolithography system 100. FIG. 2 contains plots 111 of overlay error versus a sequence of microelectronic substrates in a batch of 25 microelectronic substrates 114 in accordance with embodiments of the disclosure. In the illustrated embodiment, the overlay errors include the following: (a) a X-translation and a Y-translation 111a; (b) a substrate rotation and orthogonality 111b; (c) a field magnification and an asymmetrical magnification 111c; (d) a field rotation and a field asymmetrical rotation 111d; (e) a substrate expansion along the X-axis and along the Y-axis 111e; and (f) the maximum predicted errors along the X-axis and the Y-axis 111f of the individual microelectronic substrates 114 with respect to a sequence number of the microelectronic substrates 114. The sequence numbers are shown as discrete integers. In other embodiments, the sequence numbers can also include alphabetic, alphanumerical, and/or other desired designations.

Figure 3:
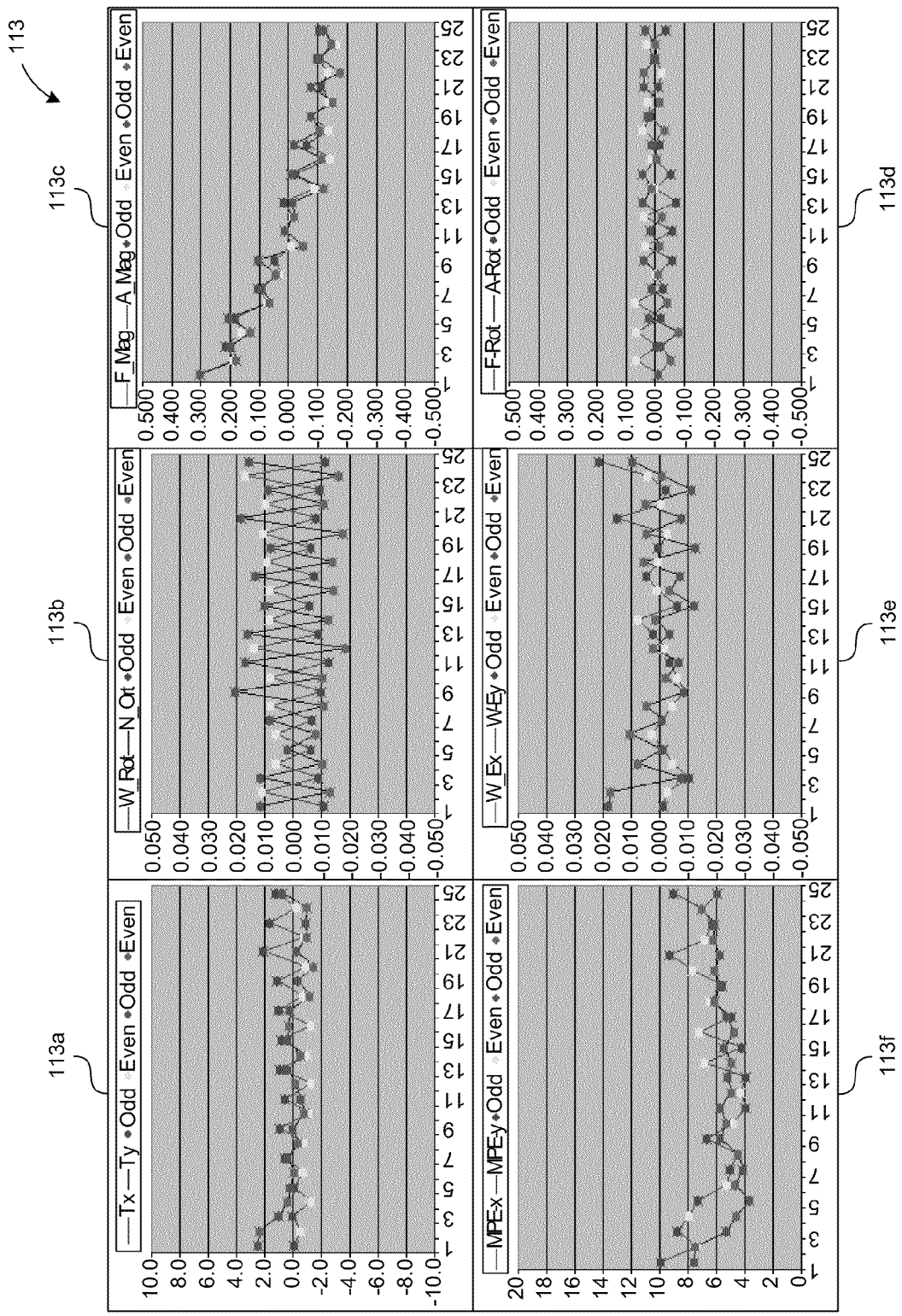
FIG. 3 contains plots of overlay error versus a sequence of microelectronic substrates in a batch of microelectronic substrates in accordance with conventional techniques.

As shown in FIG. 2, significant variations exist for at least some of these overlay errors from substrate to substrate. The inventor has recognized that without compensating for such substrate-to-substrate variations, the photolithography system 100 may have large overlay errors, thus requiring high overlay tolerances. For example, FIG. 3 contains plots 113 of overlay error versus a sequence of microelectronic substrates in a batch of microelectronic substrates 114 in accordance with conventional techniques. As shown in FIG. 3, after applying the conventional technique discussed above, at least the field magnification 113c and the substrate expansion 113e still vary significantly from substrate to substrate. Without being bound by theory, in the illustrated example, it is believed that the variations in at least these overlay errors contribute to an overall overlay error tolerance of at least 10 nm.

Based on the variations of the overlay errors shown in FIG. 2, the operator and/or the photolithography system 100 may develop mathematical models that correspond to the substrate-to-substrate variations. For example, as shown in FIG. 2, the various overlay errors are best fitted to second-order polynomials using regression to yield a plurality of mathematical models. In other embodiments, the operator and/or the photolithography system 100 may fit the substrate-to-substrate overlay errors to linear polynomials, third-order polynomials, or any other desired order of polynomials. In further embodiments, the operator and/or the photolithography system 100 may also fit the substrate-to-substrate overlay errors to conic functions (e.g., circular, elliptical, parabolic, and/or hyperbolic arc functions), trigonometric functions (e.g., sine and cosine functions), and/or other desired functions.

Figure 4:
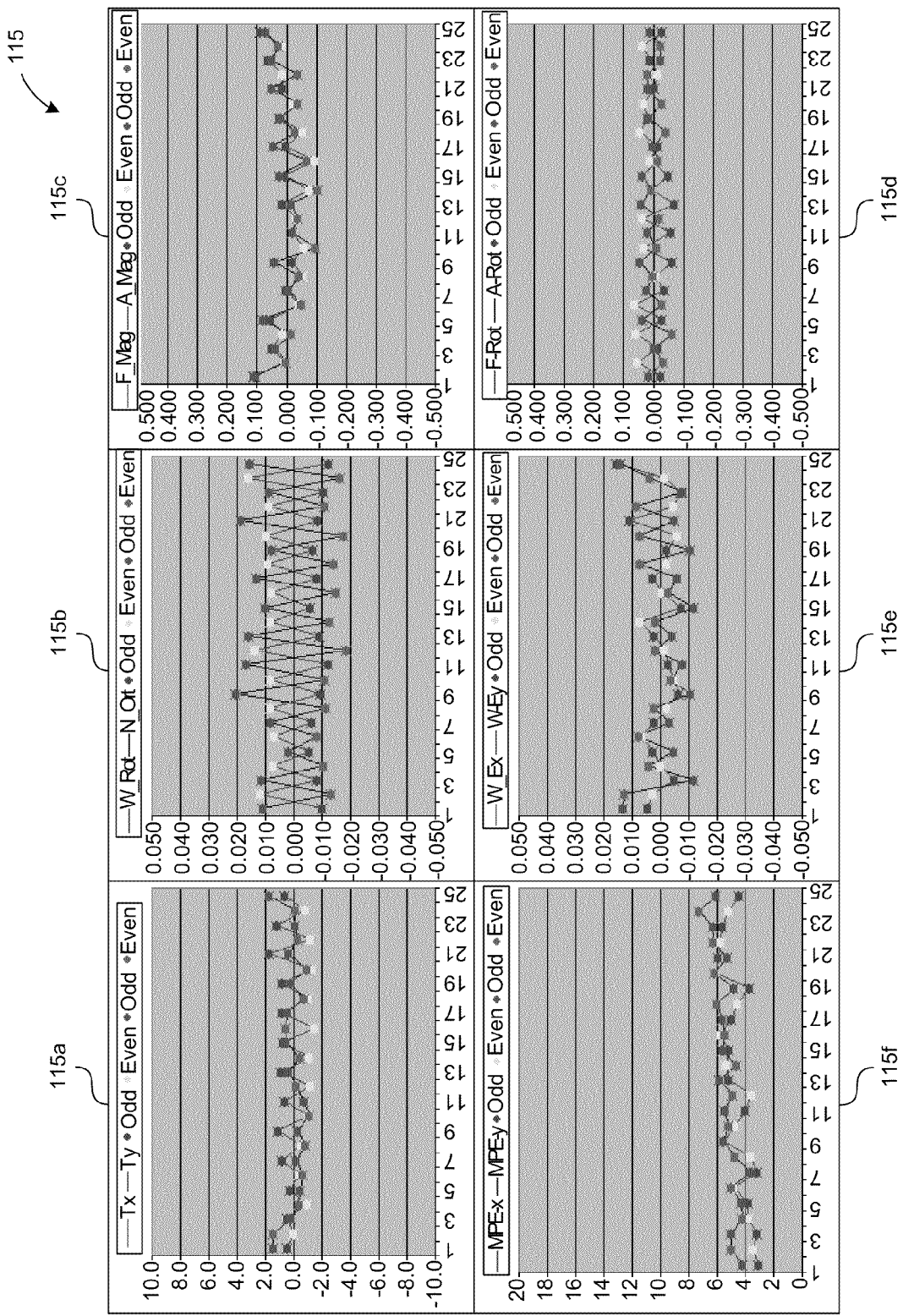
FIG. 4 contains plots of overlay error versus a sequence of microelectronic substrates in a batch of microelectronic substrates utilizing linear correction in accordance with embodiments of the disclosure.
Figure 5:
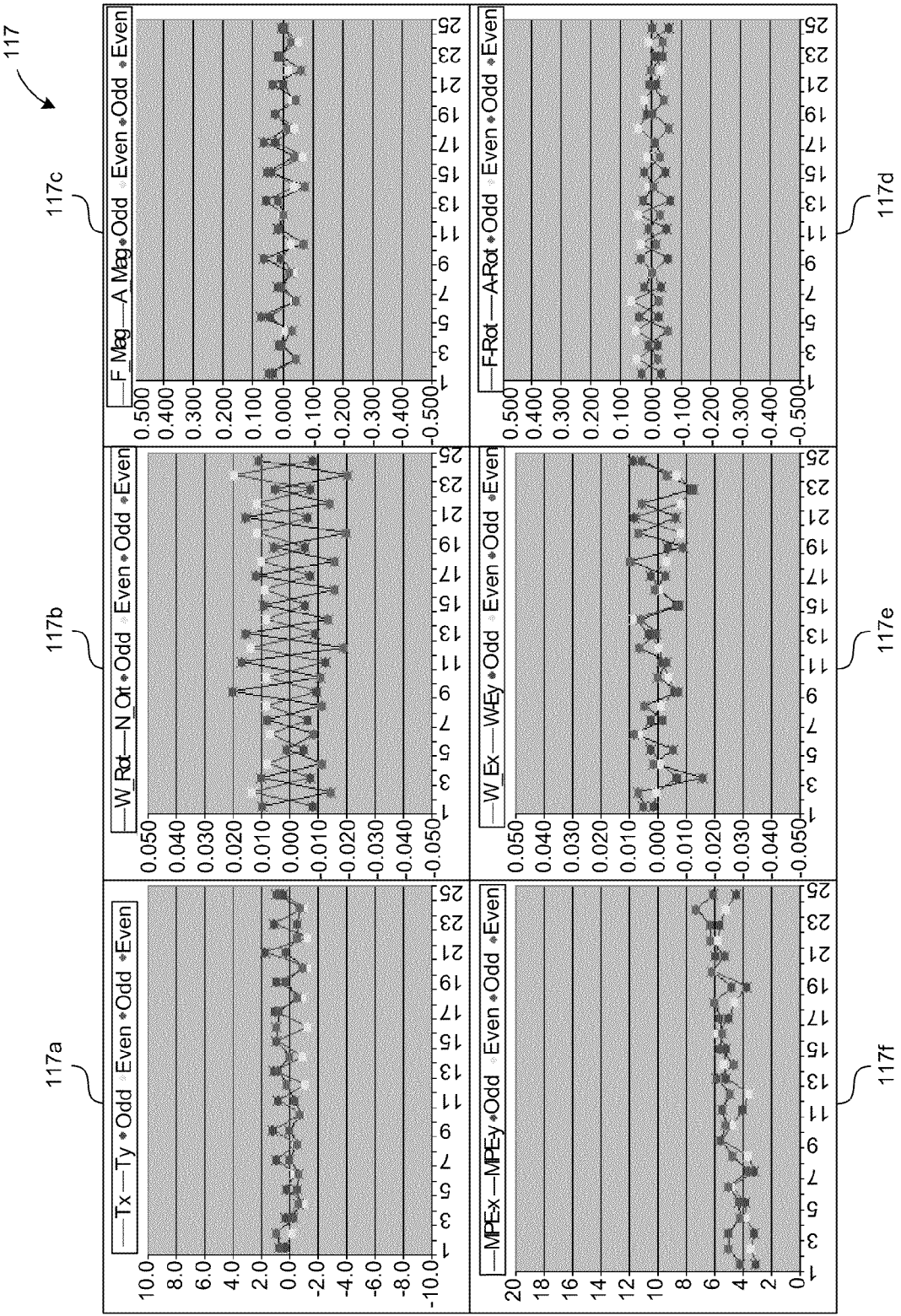
FIG. 5 contains plots of overlay error versus a sequence of microelectronic substrates in a batch of microelectronic substrates utilizing second-order correction in accordance with embodiments of the disclosure.

The inventor has recognized that applying the developed mathematical models for overlay correction during photolithography processing can reduce batchwise overlay errors. For example, FIG. 4 contains plots 115 of overlay error versus a sequence of microelectronic substrates in a batch of microelectronic substrates 114 utilizing linear models, and FIG. 5 contains plots 117 of overlay error versus a sequence of microelectronic substrates in a batch of microelectronic substrates 114 utilizing second-order models in accordance with embodiments of the disclosure. As shown in FIGS. 4 and 5, applying the batchwise overlay correction can reduce the substrate-to-substrate overlay errors in the batch, and consequently the overall overlay errors for the entire batch. For example, in the illustrated example, applying both the linear model and the second-order model produced an maximum predicted overlay error of 8 nm in the batch, which is a 20% error reduction compared to results obtained by applying the conventional technique discussed above.

Several embodiments of the photolithography system 100 can allow reduced overlay tolerances when compared to conventional techniques. As discussed above, by compensating the substrate-to-substrate variations in overlay errors, the photolithography system 100 can have reduced maximum predicted errors. As a result, the overlay tolerances for the photolithography system 100 may be lowered because the maximum predicted errors directly correspond to the overlay tolerances. As a result, the size of individual components in the microelectronic substrates 114 may be decreased to yield higher performing devices.

Even though several embodiments of the photolithography system 100 are illustrated above as being configured to address specific overlay errors, in other embodiments, the photolithography system 100 may also be configured to address reticle errors, reticle thermal shifting, and/or other overlay errors. Further, in certain embodiments, the mathematical models may be continuously or periodically updated based on additional data collected from subsequent batches of the microelectronic substrates. For example, additional data of at least some of the overlay errors may be collected for every other batch, and the collected data may be reassimilated into the mathematical models. In other examples, the operator and/or the photolithography system 100 may choose to reestablish the mathematical models because of process variations and/or other reasons based on the collected additional data.

Figure 6:
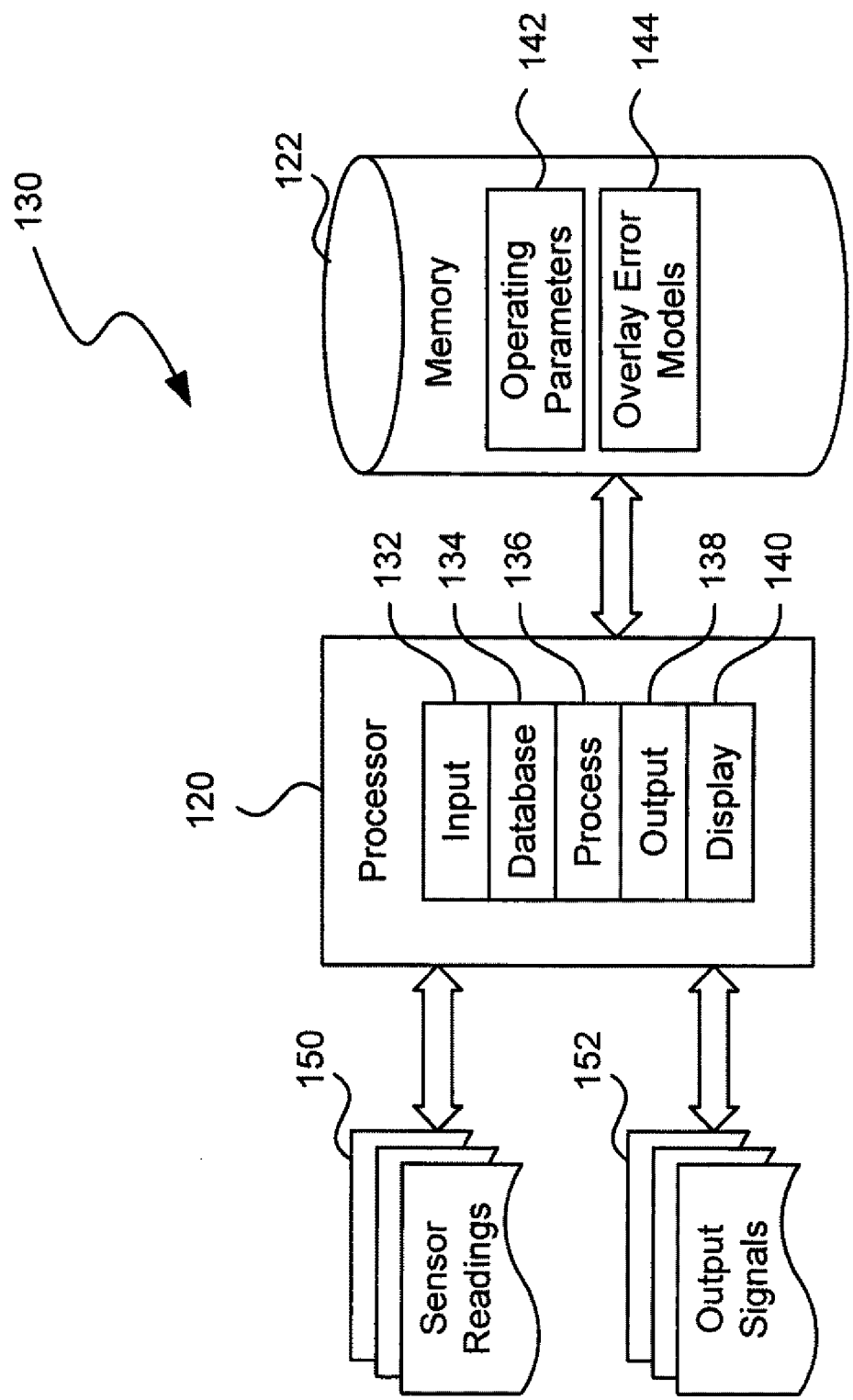
FIG. 6 is a block diagram showing computing system software modules suitable for the photolithography system of FIG. 1 in accordance with embodiments of the disclosure.

FIG. 6 is a block diagram showing computing system software modules 130 suitable for the controller 118 of FIG. 1 in accordance with embodiments of the disclosure. Each component may be a computer program, procedure, or process written as source code in a conventional programming language, such as the C++ programming language, and may be presented for execution by the processor 120 (FIG. 1) of the controller 118. The various implementations of the source code and object byte codes may be stored in the memory 122 (FIG. 1). The software modules 130 of the controller 118 may include an input module 132, a database module 134, a process module 136, an output module 138, and, optionally, a display module 140 interconnected with one another.

In operation, the input module 132 accepts an operator input, such as process setpoint (e.g., the Z-axis offset for the substrate support 112) and control selections (e.g., selection for step mode or scanning mode), and communicates the accepted information or selections to other components for further processing. The database module 134 organizes records, including operating parameters 142, overlay error models 144, and facilitates storing and retrieving of these records to and from the memory 122. The overlay error models 144 may include measured and/or derived overlay errors for the individual microelectronic substrates, as described in more detail below with reference to FIGS. 7 and 8. Any type of database organization may be utilized, including a flat file system, hierarchical database, relational database, or distributed database, such as provided by a database vendor such as the Oracle Corporation, Redwood Shores, Calif.

The process module 136 generates control variables based on sensor readings 150 from sensors (e.g., external or integrated metrology tools) and/or other data sources, and the output module 138 generates output signals 152 based on the control variables. The processor 120 optionally may include the display module 140 for displaying, printing, or downloading the sensor readings 150, the output signals 152, and/or other information via a monitor, a printer, and/or other suitable devices.

FIG. 7 is a database schema illustrating an organization of the overlay error models 144 in the memory 122 of the controller 118 in FIG. 1. In the illustrated embodiment, only the information pertaining to the set of overlay error measurements are shown for purpose of clarity. For example, as shown in FIG. 7, an overlay error model record 175 can include the following information: a substrate number 176 and mathematical models of an X-translation 177, a Y-translation 178, a substrate rotation 179, a substrate orthogonality 180, a field magnification 181, an asymmetrical magnification 182, a field rotation 183, a field asymmetrical rotation 184, a substrate expansion along the X-axis 185, a substrate expansion along the Y-axis 186, a maximum predicted error along the X-axis 187, and a maximum predicted error along the Y-axis 188. In other embodiments, the overlay error model record 175 can also include historical data and/or other pertinent data (not shown).

Figure 8:
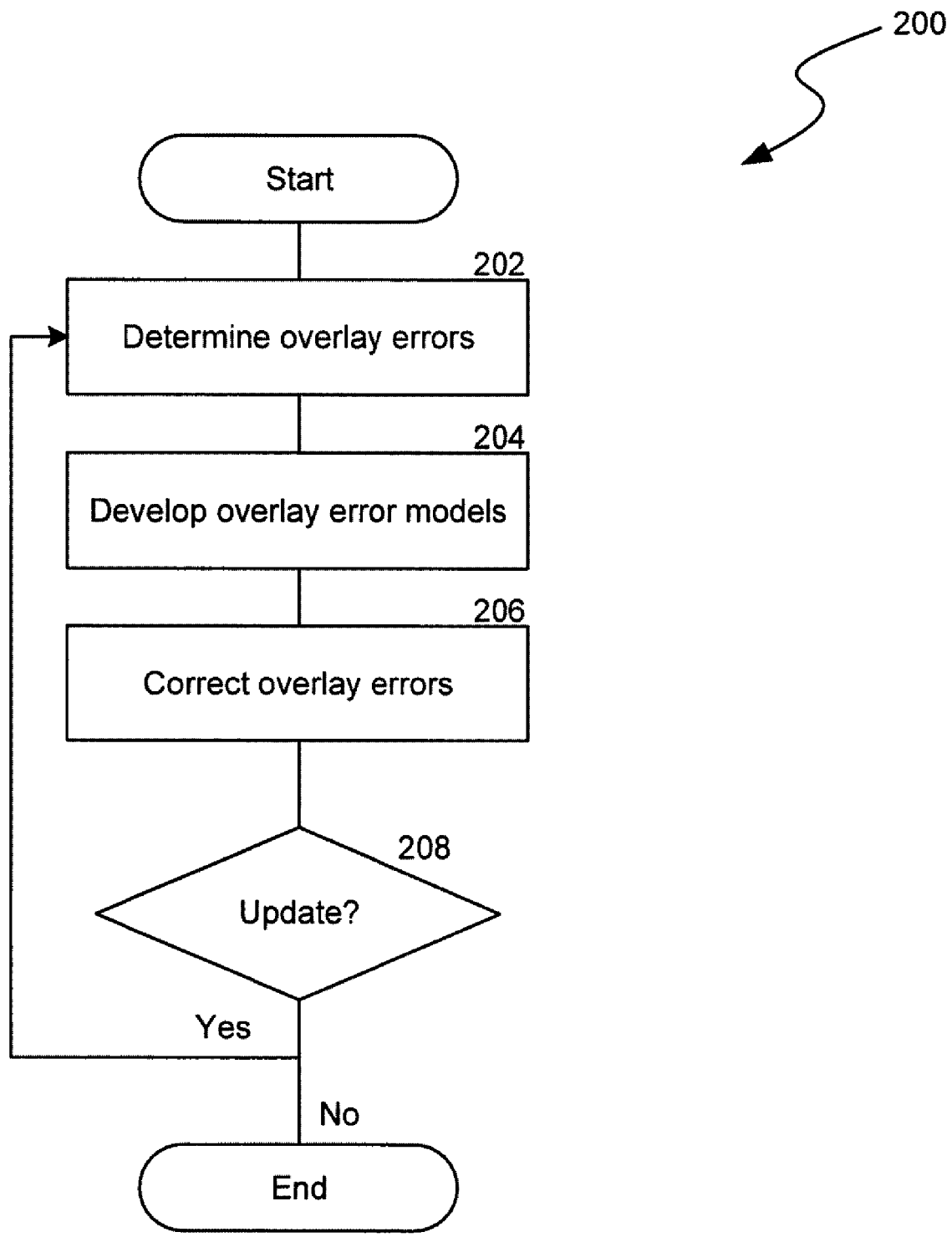
FIG. 8 is a flowchart showing a method for correcting overlay errors in a batch of microelectronic substrates in a photolithography system in accordance with embodiments of the disclosure.

FIG. 8 is a flowchart showing a method 200 for correcting overlay errors in a batch of microelectronic substrates in a photolithography system in accordance with embodiments of the disclosure. As shown in FIG. 8, the method 200 includes determining overlay errors for individual microelectronic substrates in a batch at stage 202. In one embodiment, determining overlay errors can include determining at least one of an X-translation, a Y-translation, a substrate rotation, a substrate orthogonality, a field magnification, an asymmetrical magnification, a field rotation, a field asymmetrical rotation, a substrate expansion along the X-axis, a substrate expansion along the Y-axis, a maximum predicted error along the X-axis, and a maximum predicted error along the Y-axis. In other embodiments, determining overlay errors can also include determining irregularities of the reticle 108 (FIG. 1), and/or other parameters.

The method 200 can include developing at least one substrate-to-substrate overlay error model for the batch at stage 204. In one embodiment, developing the overlay error model can include deriving linear, second-order, and/or other suitable order polynomials to describe the substrate-to-substrate variations in the overlay errors. Suitable techniques for deriving the polynomial can include linear regression, interpolation, and/or other suitable modeling techniques. In other embodiments, conic models (e.g., circular, elliptical, parabolic, and/or hyperbolic arc models), trigonometric models (e.g., sine and cosine models), and/or other desired types of models may be used.

The method 200 can also include correcting the overlay errors during the exposure of a microelectronic substrate based on information from the developed overlay error models at stage 206. For example, in one embodiment, correcting the overlay errors may include shifting the substrate support 112 (FIG. 1) based on at least one of the X-translation and the Y-translation models. In another example, correcting the overlay errors may include adjusting the focus of the condenser lens 104 and/or the objective lens 110, modifying the reticle 108, or varying the operations of other components of the photolithography system 100 of FIG. 1.

Optionally, the method 200 can include updating the overlay error models at stage 208. A decision can be made to determine whether the overlay error models should be updated. In one embodiment, if an inspection indicates that the overlay errors are above a threshold, then at least one of the overlay error models can be updated by reverting to determining overlay errors at stage 202; otherwise, the process may end. In other embodiments, the operator may elect to update the overlay error models because of process changes, periodic refreshing, and/or other reasons.

From the foregoing, it will be appreciated that specific embodiments of the disclosure have been described herein for purposes of illustration, but that various modifications may be made without deviating from the disclosure. For example, even though FIGS. 2-5 show relationships of the overlay errors with respect to the sequence of the microelectronic substrates, in other embodiments, the relationships may also be based on an elapsed operating time, operator indications, and/or other suitable indicators of the progress through the batch. In addition, many of the elements of one embodiment may be combined with other embodiments in addition to or in lieu of the elements of the other embodiments. Accordingly, the disclosure is not limited except as by the appended claims.

I claim:

1. A method for correcting overlay errors in a photolithography system, the method comprising:
measuring a plurality of first overlay errors individually corresponding to a microelectronic substrate in a first batch of microelectronic substrates;
determining a relationship between the first overlay errors and a first sequence of the microelectronic substrates in the first batch; and
correcting a second overlay error of individual microelectronic substrates in a second batch based on
a second sequence of the microelectronic substrates in the second batch corresponding to the first sequence of the microelectronic substrates in the first batch such that the correction of the second overlay error of the individual microelectronic substrates in the second batch are based on the measurement of a corresponding microelectronic substrate in the first batch, and
the determined relationship between the first overlay errors and the first sequence of the microelectronic substrates in the first batch.

2. The method of claim 1 wherein measuring a first overlay error includes:
measuring a first overlay error that includes at least one of an X-translation, a Y-translation, a substrate rotation, a substrate orthogonality, a field magnification, an asymmetrical magnification, a field rotation, a field asymmetrical rotation, a substrate expansion along the X-axis, and a substrate expansion along the Y-axis of the individual microelectronic substrates in the first batch;
and wherein determining a relationship includes determining at least one of a linear relationship or a second-order relationship between at least one of the X-translation, the Y-translation, the substrate rotation, the substrate orthogonality, the field magnification, the asymmetrical magnification, the field rotation, the field asymmetrical rotation, the substrate expansion along the X-axis, and the substrate expansion along the Y-axis of the individual microelectronic substrates with respect to the first sequence of microelectronic substrates in the first batch;

and further wherein correcting a second overlay error includes correcting at least one of the X-translation, the Y-translation, the substrate rotation, the substrate orthogonality, the field magnification, the asymmetrical magnification, the field rotation, the field asymmetrical rotation, the substrate expansion along the X-axis, and the substrate expansion along the Y-axis of the individual microelectronic substrates in the second batch based on the determined linear relationship and/or the second-order relationship and the second sequence of the microelectronic substrates in the second batch.

3. The method of claim 1 wherein measuring a first overlay error includes measuring at least one of an X-translation, a Y-translation, a substrate rotation, a substrate orthogonality, a field magnification, an asymmetrical magnification, a field rotation, a field asymmetrical rotation, a substrate expansion along the X-axis, and a substrate expansion along the Y-axis of the individual microelectronic substrates in the first batch.

4. The method of claim 1 wherein determining a relationship includes performing linear and/or second-order regression on the measured overlay errors with respect to the first sequence of microelectronic substrates in the first batch.

5. The method of claim 1 wherein determining a relationship includes determining a substrate-to-substrate variation of the measured overlay errors with respect to the first sequence of microelectronic substrates in the first batch.

6. The method of claim 1, further comprising determining a first overlay parameter for a first microelectronic substrate in the second batch and a second overlay parameter for a second microelectronic substrate in the second batch based on the second sequence of the microelectronic substrates in the second batch and the determined relationship between the first overlay errors and the first sequence of the microelectronic substrates in the first batch, the first overlay parameter being different than the second overlay parameter.

7. The method of claim 1, further comprising determining a first overlay parameter for a first microelectronic substrate in the second batch and a second overlay parameter for a second microelectronic substrate in the second batch based on the second sequence of the microelectronic substrates in the second batch and the determined relationship between the first overlay errors and the first sequence of the microelectronic substrates in the first batch, the first overlay parameter being different than the second overlay parameter, and wherein correcting a second overlay error includes individually correcting an overlay error for the first and second microelectronic substrates based on the first and second overlay parameters, respectively.

8. The method of claim 1 wherein determining a relationship includes determining a linear relationship between the first overlay errors and the first sequence, and wherein the method further includes determining a first overlay parameter for a first microelectronic substrate in the second batch and a second overlay parameter for a second microelectronic substrate in the second batch based on the determined linear relationship, and wherein correcting a second overlay error includes individually correcting an overlay error for the first and second microelectronic substrates based on the first and second overlay parameters, respectively.

9. The method of claim 1 wherein determining the relationship includes determining a linear relationship and/or a higher-order relationship of the measured plurality of first overlay errors of the microelectronic substrates in the first batch, and wherein correcting the second overlay error of the microelectronic substrates in the second batch is based on the determined linear relationship and/or the higher-order relationship.

10. A method for correcting overlay errors in a photolithography system, the method comprising:
receiving a set of overlay errors in which individual overlay errors correspond to an individual microelectronic substrate in a set of microelectronic substrates; and
computing a mathematical model based on the overlay errors and a sequence of the microelectronic substrates to correct overlay errors of subsequently processed microelectronic substrates based on overlay errors of respective microelectronic substrates in the set of microelectronic substrates.

11. The method of claim 10 wherein receiving the set of overlay errors includes receiving at least one of an X-translation, a Y-translation, a substrate rotation, a substrate orthogonality, a field magnification, an asymmetrical magnification, a field rotation, a field asymmetrical rotation, a substrate expansion along the X-axis, and a substrate expansion along the Y-axis of the individual microelectronic substrates in a batch.

12. The method of claim 10 wherein the plurality of microelectronic substrates are a first plurality of microelectronic substrates, and wherein the method further comprises
retrieving the mathematical model computed based on the overlay error and the sequence of the first plurality of microelectronic substrates; and
calculating an overlay correction parameter for a microelectronic substrate based on the retrieved mathematical model and a sequence of the microelectronic substrates in a second plurality of microelectronic substrate.

13. The method of claim 10 wherein the plurality of microelectronic substrates are a first plurality of microelectronic substrates, and wherein the set of overlay errors is a first set of overlay errors, and wherein the method further comprises:
receiving a second set of overlay errors of individual microelectronic substrates in a second plurality of microelectronic substrates;
purging the computed mathematical model based on the first set of overlay errors; and
computing a new mathematical model based on the second set of overlay errors and a sequence of the second plurality of microelectronic substrates.

14. The method of claim 10 wherein the plurality of microelectronic substrates are a first plurality of microelectronic substrates, and wherein the set of overlay errors is a first set of overlay errors, and wherein the method further comprises:
receiving a second set of overlay errors of individual microelectronic substrates in a second plurality of microelectronic substrates;
reassimilating the mathematical model based on the second set of overlay errors and a sequence of the second plurality of microelectronic substrates.

15. A method for correcting overlay errors in a photolithography system, the method comprising:
storing a sequence number of a microelectronic substrate in a first set of microelectronic substrates; and
storing a mathematical model of at least one of an X-translation, a Y-translation, a substrate rotation, a substrate orthogonality, a field magnification, an asymmetrical magnification, a field rotation, a field asymmetrical rotation, a substrate expansion along the X-axis, and a substrate expansion along the Y-axis of the individual microelectronic substrates with respect to the sequence number; and
correcting at least one overlay error of a microelectronic substrate in a second set of microelectronic substrates having the same sequence number as the microelectronic substrate in the first set of microelectronic substrates using the mathematical model.

16. The method of claim 15 wherein the storing the sequence number includes storing discrete integers identifying the individual microelectronic substrates in the set.

17. The method of claim 15 wherein storing the mathematical model comprises storing the mathematical model as a linear polynomial or a second-order polynomial.

18. A method for correcting overlay errors in a photolithography system, the method comprising:

processing a first batch of microelectronic substrates in a first sequence;

measuring a plurality of first overlay errors corresponding to respective microelectronic substrates in the first batch; and correcting a second overlay error of each microelectronic substrates in a second batch using a substrate-to-substrate mathematical model based on the first overlay error of the respective microelectronic substrate in the first batch.

19. The method of claim 18 wherein correcting the second overlay error of each microelectronic substrate includes substrate-to-substrate correction of processing overlay errors of the microelectronic substrates in the second batch.

20. The method of claim 18 wherein measuring the plurality of first overlay errors includes measuring an overlay error of a first microelectronic substrate and a second microelectronic substrate in the first batch, and wherein correcting the second overlay error includes correcting a processing error of a first microelectronic substrate in the second batch based on the measurement of the overlay error of the first microelectronic substrate in the first batch and also correcting processing of a second microelectronic substrate in the second batch based on the measurement of the overlay error of the second microelectronic substrate in the first batch.

* * * * *